US012614584B2

(12) United States Patent
Yang

(10) Patent No.: US 12,614,584 B2
(45) Date of Patent: Apr. 28, 2026

(54) METHOD FOR ADJUSTING LOGIC STATES OF DATA STROBE SIGNALS USED BY MEMORY DEVICE

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 136 days.

(21) Appl. No.: 18/379,819

(22) Filed: Oct. 13, 2023

(65) Prior Publication Data

US 2025/0124972 A1 Apr. 17, 2025

(51) Int. Cl.
*G11C 11/4096* (2006.01)
*G11C 11/16* (2006.01)
*G11C 11/4076* (2006.01)

(52) U.S. Cl.
CPC ...... *G11C 11/4096* (2013.01); *G11C 11/1693* (2013.01); *G11C 11/4076* (2013.01)

(58) Field of Classification Search
CPC ..................... G11C 11/4096; G11C 11/4076
See application file for complete search history.

(56) References Cited

U.S. PATENT DOCUMENTS 6,016,066 A 1/2000 Ilkbahar
7,782,685 B2 8/2010 Kim et al.

2005/0134314 A1* 6/2005 Prather .......... H03K 19/018528
326/86
2006/0215462 A1* 9/2006 Seo ..................... G11C 7/1066
365/189.05
2009/0257294 A1* 10/2009 Searles ............... G06F 13/4243
330/253
2011/0292739 A1* 12/2011 Song .................... G11C 7/1093
365/189.05

(Continued)

FOREIGN PATENT DOCUMENTS

TW 201511001 A 3/2015
TW I559321 B 11/2016

(Continued)

OTHER PUBLICATIONS

Office Action and Search Report mailed on Nov. 8, 2024 related to Taiwanese Application No. 112149348.

(Continued)

*Primary Examiner* — Mushfique Siddique
(74) *Attorney, Agent, or Firm* — Xuan Zhang

(57) ABSTRACT

A control unit in a memory and a method of controlling a memory are provided. The control unit includes a first input stage, a second input stage, a first output stage, and a second output stage. The first input stage is configured to receive a first signal and a second signal. The second input stage is configured to receive the first signal and the second signal. The first output stage is connected to the first input stage and configured to generate a first processed signal. The second output stage is connected to the second input stage and configured to generate a second processed signal. If the first signal and the second signal are identical, the first processed signal and the second processed signal are different.

13 Claims, 10 Drawing Sheets

(56)  References Cited

U.S. PATENT DOCUMENTS

2012/0269296 A1\*  10/2012  Chuang .............. H03F 3/45179
                                                          375/316
2015/0074346 A1     3/2015  Luo et al.
2015/0155012 A1     6/2015  Hwang
2018/0075884 A1\*   3/2018  Choi ..................... G06F 3/0679
2023/0395106 A1\*  12/2023  Lin ..................... G11C 7/1084

FOREIGN PATENT DOCUMENTS

TW         201743329  A     12/2017
TW           I781592  B     10/2022

OTHER PUBLICATIONS

Office Action and and the search report mailed on May 28, 2025 related to Taiwanese Application No. 113117336.
Office Action and and the search report mailed on Jun. 25, 2025 related to U.S. Appl. No. 18/518,549.
Summary translation of Office Action and and the search report mailed on May 28, 2025 related to Taiwanese Application No. 113117336.

\* cited by examiner $$V3 = \frac{R50}{(R21+R22)//(R23+R24)+R11+R50} * VDD \ldots\ldots\text{Equation 1}$$

$$V4 = \frac{(R41+R42)//(R43+R44)+R31}{(R41+R42)//(R43+R44)+R31+R51} * VDD \dots\dots Equation\ 2$$

METHOD FOR ADJUSTING LOGIC STATES OF DATA STROBE SIGNALS USED BY MEMORY DEVICE

TECHNICAL FIELD

The present disclosure relates to a control unit of a memory and a method of controlling a memory, and more particularly, to a control unit including at least one input stage and at least one output stage.

DISCUSSION OF THE BACKGROUND

The double data rate synchronous dynamic random-access memory (DDR SDRAM) uses a data strobe signal to synchronize the data transfer between the sender and receiver. However, in some cases, the data strobe signal may not follow the JEDEC standard and thus cause the DDR SDRAM to malfunction. It is to the provision of a method for adjusting logic states of the data strobe signal that the present disclosure is primarily directed.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a control unit of a memory including a first input stage, a second input stage, a first output stage, and a second output stage. The first input stage is configured to receive a first signal and a second signal. The second input stage is configured to receive the first signal and the second signal. The first output stage is connected to the first input stage and configured to generate a first processed signal. The second output stage is connected to the second input stage and configured to generate a second processed signal. If the first signal and the second signal are identical, the first processed signal and the second processed signal are different.

Another aspect of the present disclosure provides a control unit of a memory including a first input stage and a first output stage. The first input stage includes a first input terminal configured to receive a first signal and a second input terminal configured to receive a second signal. The first output stage is connected to the first input stage and includes an output terminal configured to generate a first processed signal. If the first signal and the second signal are identical, the first input stage is open-circuit to dissociate the first processed signal from the first signal.

Another aspect of the present disclosure provides a method of controlling a memory, including receiving a first signal and a second signal by a first input stage; receiving the first signal and the second signal by a second input stage; generating a first processed signal by a first output stage connected to the first input stage; generating a second processed signal by a second output stage connected to the second input stage; and differentiating the first processed signal from the second processed signal if the first signal and the second signal are identical.

The control unit of the memory of the present disclosure includes a first input stage, a second input stage, a first output stage, and a second output stage. The first input stage and the second input stage are configured to receive a first signal and a second signal (e.g., from a memory controller). The first output stage and the second output stage are configured generate a first processed signal and a second processed signal, which may be transmitted to an internal control circuit of the memory or may be used as a clock signal of the data lines of the memory for synchronization. The state of the first input stage and the second input stage change based on whether the first signal and the second signal are identical or different. If the first signal and the second signal are identical, the first input stage and the second input stage are open-circuit (or off) to differentiate the first processed signal from the second processed signal. The first processed signal is dissociated from the first signal, and the second processed signal is dissociated from the second signal. If the first signal and the second signal are different, the first input stage and the second input stage are conducting (or on) to associate the first processed signal and the second processed signal to the first signal and the second signal, respectively (i.e., the first processed signal and the second processed signal being identical to the first signal and the second signal, respectively). The adjustable state of the first input stage and the second input stage allows the control unit to accept the first signal and the second signal which violate the JEDEC standard (e.g., the data strobe signals having the same value). In the conducting state, the control unit is configured to let the first processed signal and the second processed signal follow the first signal and the second signal. In the open-circuit state, the control unit is configured to regenerate the first processed signal and the second processed signal, which are dissociated from the first signal and the second signal. The memory can operate successfully with the first processed signal and the second processed signal.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
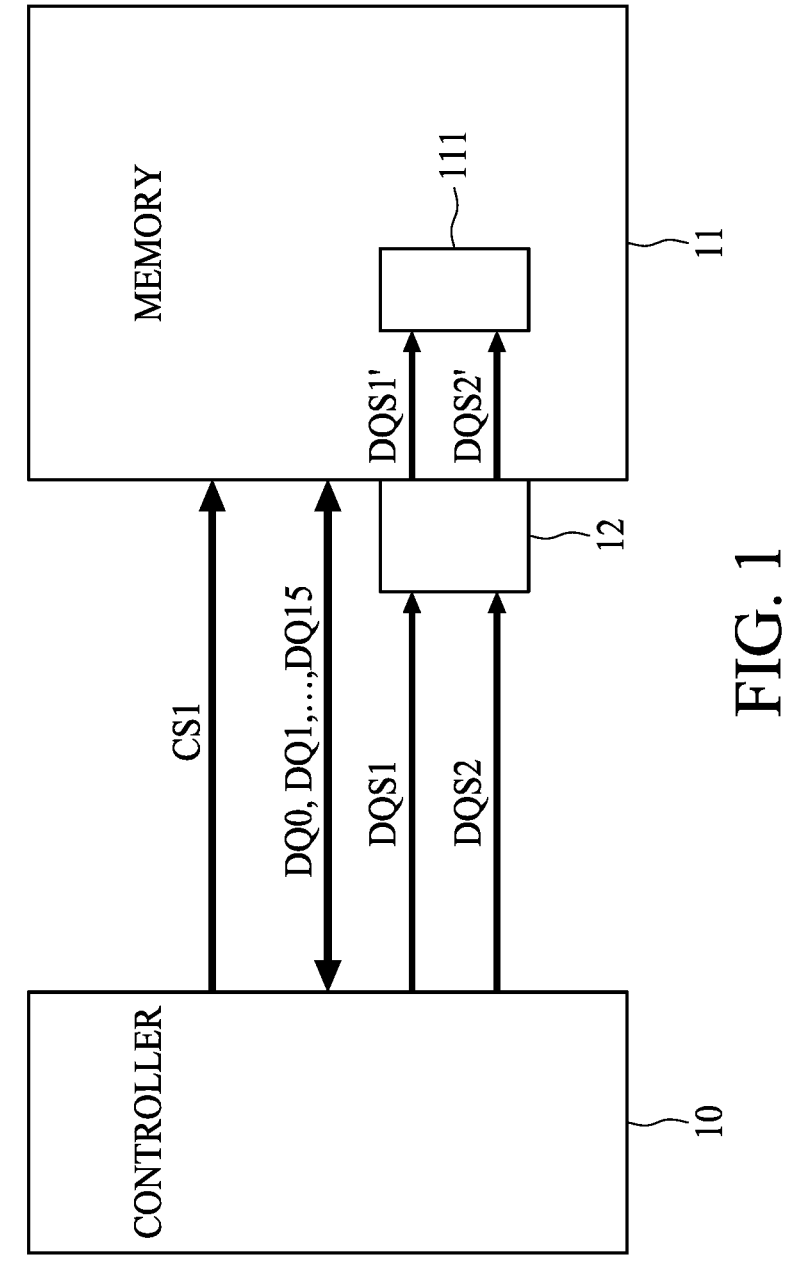
FIG. 1 is a block diagram of an electronic device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of an electronic device 100 in accordance with some embodiments of the present disclosure. The electronic device 100 includes a controller 10 and a memory 11 in communication with the controller 10 via a wire, a system bus, or wirelessly. The controller 10 may include a CPU. The memory 11 may include a double data rate synchronous dynamic random-access memory (DDR SDRAM) or the like.

The controller 10 is configured to access the memory 11. The memory 11 is configured to store data. The controller 10 is configured to generate a command control signal CS1 and transmit it to the memory 11 via, e.g., a command line. The controller 10 and the memory 11 communicate with each other via data lines DQ0, DQ1, . . . , DQ15. The data lines DQ0, DQ1, . . . , DQ15 are configured to transfer data to and from the memory 11 or the controller 10. The controller 10 and the memory 11 communicate with each other via bidirectional lines, which transfer a first signal (or an input signal) DQS1 and a second signal (or an input signal) DQS2 to and from the memory or the controller 10. The first signal DQS1 and the second signal DQS2 may be data strobe signals (e.g., write data strobe signals). The first signal DQS1 may be a positive data strobe signal and the second signal DQS2 may be a negative data strobe signal. The memory 11 may be configured to transfer two data words per clock cycle, using both the positive and the negative edge of the clock. With each word of data, the first signal DQS1 and the second signal DQS2 are transferred for synchronization.

The memory 11 includes a control unit 111 and a control unit 12 in communication with the control unit 111. In some embodiments, the control unit 111 is integrated with the control unit 112.

The control unit 111 may include a command decoder configured to interpret the command control signal CS1, an address multiplexer which selects the appropriate memory bank and row/column address based on the command control signal CS1 and address signals, and a data I/O circuit configured to handle the input and the output of the data to and from the memory bank/array, and a clock generator configured to generate clock signals for the memory 11.

The control unit 12 is configured to receive the first signal DQS1 and the second signal DQS2 and generate a third signal DQS1' and a fourth signal DQS2'. The control unit 12 may include a differential amplifier that amplifies the difference between the first signal DQS1 and the second signal DQS2 while rejecting any common-mode signals. The enhanced third signal DQS1' and the fourth signal DQS2' are transferred to the control unit 111 via, e.g., wires or a bus. The enhanced third signal DQS1' and the fourth signal DQS2' may be referred to as data strobe signals and used as timing signals to align the data with the clock signal during data transfers.

Figure 2:
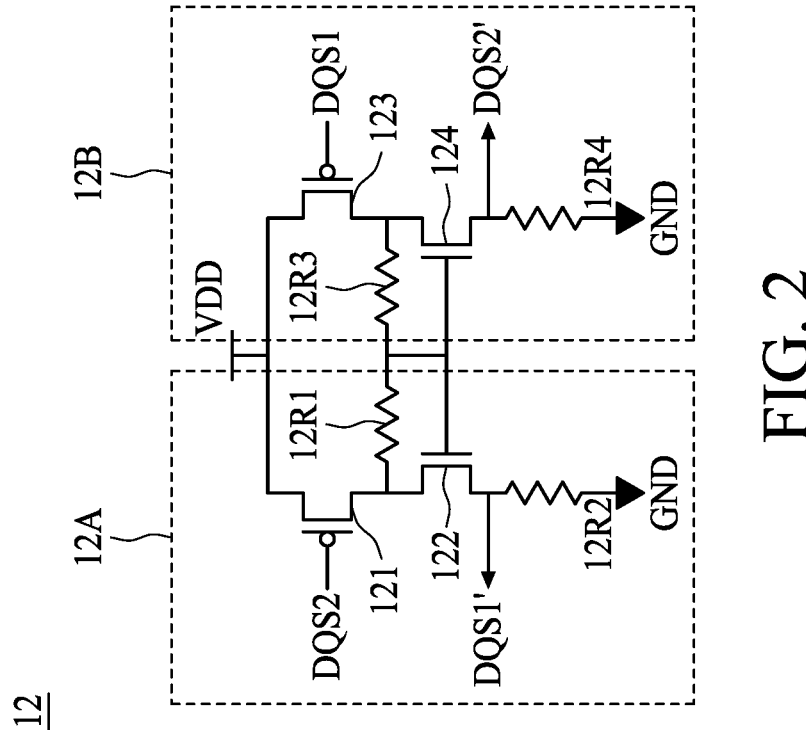
FIG. 2 is a schematic diagram of a control unit of a memory in accordance with some embodiments of the present disclosure.

FIG. 2 is a schematic diagram of a control unit (e.g., the control unit 12) of a memory (e.g., the memory 11) in accordance with some embodiments of the present disclosure.

The control unit 12 may include a first portion 12A and a second portion 12B. The first portion 12A includes a p-type transistor 121, an n-type transistor 122, a resistor 12R1, and a resistor 12R2. The second portion 12B includes a p-type transistor 123, an n-type transistor 124, a resistor 12R3, and a resistor 12R4. The p-type transistor 121 and the p-type transistor 123 may include a p-type MOS field-effect transistor (FET). The n-type transistor 122 and the n-type transistor 124 may include an n-type MOSFET.

The p-type transistor 121 has a source connected to a supply voltage VDD, a gate configured to receive the second signal DQS2, and a drain connected to the resistor 12R1. The n-type transistor 122 has a drain connected to the drain of the p-type transistor 121, a gate connected to the resistor 12R1, and a source connected to the resistor 12R2 and configured to generate the third signal DQS1'. The resistor 12R1 is connected to the resistor 12R3. The resistor 12R2 is connected to a ground GND. The p-type transistor 123 has a source connected to the supply voltage VDD, a gate configured to receive the first signal DQS1, and a drain connected to the resistor 12R3. The n-type transistor 124 has a drain connected to the drain of the p-type transistor 123, a gate connected to the resistor 12R3, and a source connected to the resistor 12R4 and configured to generate the third signal DQS2'. The resistor 12R4 is connected to the ground GND.

The table 1-1 describes the logic values of the first signal DQS1, the second signal DQS2, the third signal DQS1', and the fourth signal DQS2' according to the control unit 12.

TABLE 1-1

| DQS1 | DQS2 | DQS1' | DQS2' |
|------|------|-------|-------|
| 0 | 0 | 1 | 1 |
| 0 | 1 | 0 | 1 |
| 1 | 0 | 1 | 0 |
| 1 | 1 | 0 | 0 |

The first signal DQS1 and the second signal DQS2 are supposed to be a differential pair, which means that the first signal DQS1 and the second signal DQS2 are complementary, e.g., the first signal DQS1 has a high logic value "1", while the second signal DQS2 has a low logic value "0" and vice versa. In some cases, the first signal DQS1 and the second signal DQS2 may violate the JEDEC standard, e.g., accidentally set as the same logic value, e.g., a logic high value "1" or a logic low value "0". The third signal DQS1' and the fourth signal DQS2' thus have the same logic value. The non-complementary third signal DQS1' and the fourth signal DQS2' may cause a malfunction of the memory 11 when they are transmitted to the control unit 111. In some embodiments, non-complementary data strobe signals DQS1' and DQS2' may cause a failed data write operation of the memory 11.

Figure 3:
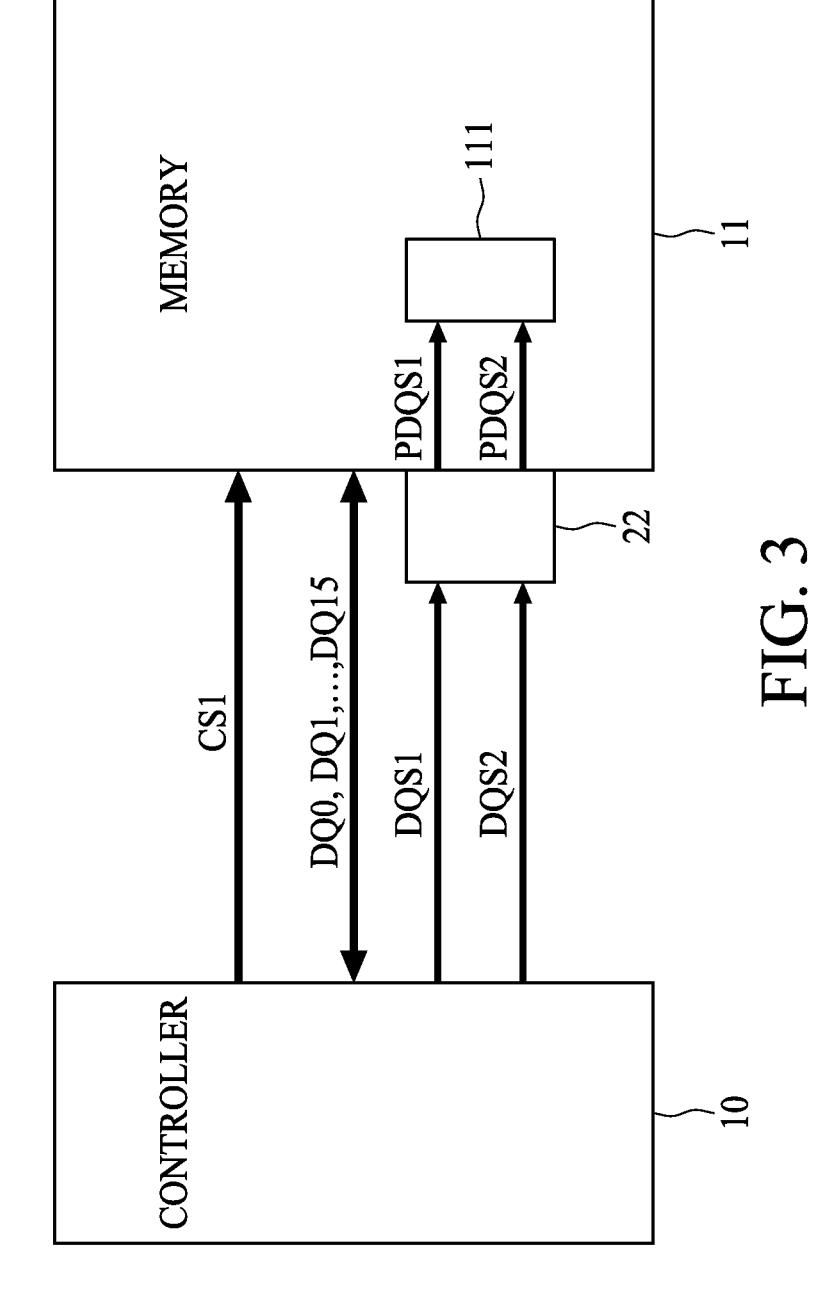
FIG. 3 is a block diagram of an electronic device in accordance with some embodiments of the present disclosure.

FIG. 3 is a block diagram of an electronic device 200 in accordance with some embodiments of the present disclosure. The characteristics of the elements with the same reference numerals as those in FIG. 3 correspond to the relevant descriptions of FIG. 1. The control unit 12 of the electronic device 100 of FIG. 1 may be replaced by a control unit 22 of FIG. 3. In some embodiments, the control unit 12 may be preserved in the memory 11 and the control unit 22 is an element of the memory 11 that firstly receives the first signal DQS1 and the second signal DQS2.

The control unit 22 is in communication with the control unit 111 via a wire and a system bus. The control unit 22 is configured to receive the first signal DQS1 and the second signal DQS2 and generate a first processed signal PDQS1 and a second processed signal PDQS2. The first processed signal PDQS1 and the second processed signal PDQS2 may be complementary, regardless of the first signal DQS1 and the second signal DQS2 being identical or different. The memory can operate successfully with the complementary first processed signal PDQS1 and the second processed signal PDQS2. The complementary first processed signal PDQS1 and the second processed signal PDQS2 are referred to as (write) data strobe signals, and are used as timing signals to align the data with the clock signal during data transfers. The memory 11 may be configured to transfer two data words per clock cycle, using both the positive and the negative edge of the clock. With each word of data, the differential pair of the first processed signal PDQS1 and the second processed signal PDQS2 is transferred for synchronization.

Figure 4:
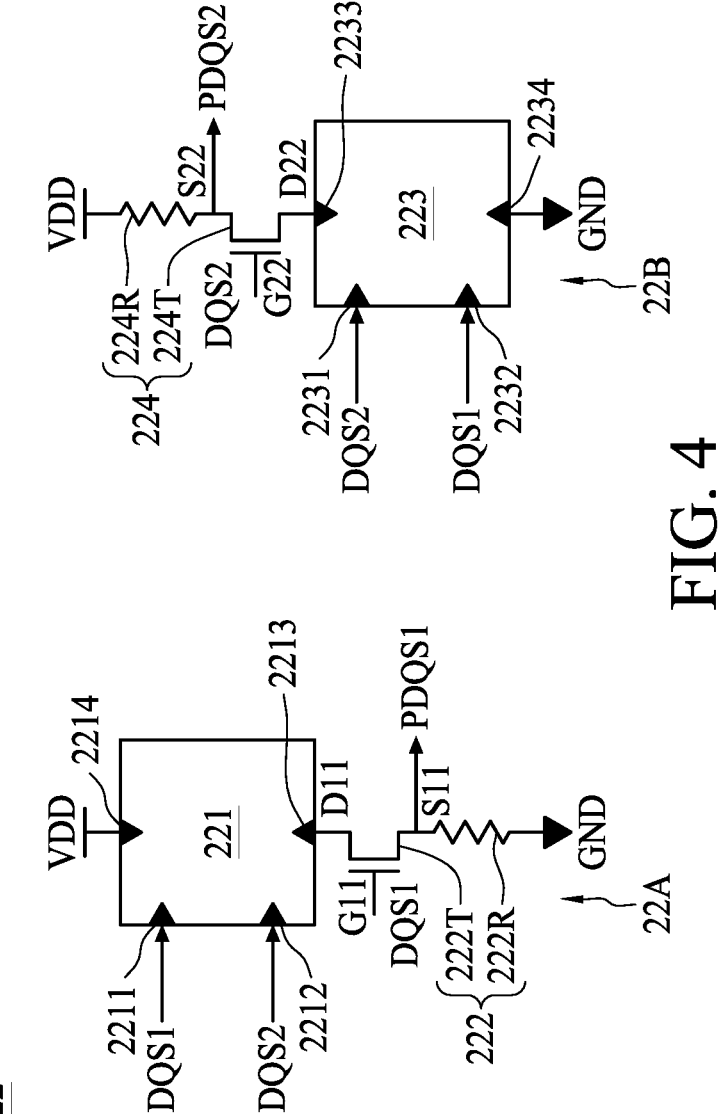
FIG. 4 is a schematic diagram of a control unit of a memory in accordance with some embodiments of the present disclosure.

FIG. 4 is a schematic diagram of a control unit (e.g., the control unit 22) of a memory (e.g., the memory 11) in accordance with some embodiments of the present disclosure.

The control unit 22 may include a first portion 22A and a second portion 22B. In FIG. 4, the first portion 22A and the second portion 22B are separated for explanatory purposes. The first portion 22A and the second portion 22B may be physically or electrically connected.

The first portion 22A of the control unit 22 includes a first input stage 221 and a first output stage 222 connected to the first input stage 221. The first input stage 221 is configured to receive the first signal DQS1 and the second signal DQS2. The first output stage 222 is configured to generate the first processed signal PDQS1. The first input stage 221 has a first input terminal 2211, a second input terminal 2212, a terminal 2213, and a terminal 2214. The first input terminal 2211 of the first input stage 221 is configured to receive the first signal DQS1. The second input terminal 2212 of the first input stage 221 is configured to receive the second signal DQS2. The terminal 2213 is connected to the first output stage 222. The terminal 2214 is connected to the supply voltage VDD.

The first output stage 222 includes a transistor 222T and a resistor 222R. The transistor 222T may include an n-type MOSFET. The transistor 222T and the resistor 222R may be configured as a source follower. The transistor 222T has a drain D11 connected to the terminal 2213 of the first input stage 221, a gate G11 configured to receive the first signal DQS1, and a source S11 configured to output the first processed signal PDQS1. The source S11 of the transistor 222T is connected to the resistor 222R. The resistor 222R is connected to the ground GND. The first output stage 222 has an input terminal (i.e., the gate G11) configured to receive the first signal DQS1 and an output terminal (i.e., the source S11) configured to output the first processed signal PDQS1.

The second portion 22B of the control unit 22 includes a second input stage 223 and a second output stage 224 connected to the second input stage 223. The second input stage 223 is configured to receive the first signal DQS1 and the second signal DQS2. The second output stage 224 is configured to generate the second processed signal PDQS2. The second input stage 223 has a first input terminal 2231, a second input terminal 2232, a terminal 2233, and a terminal 2234. The first input terminal 2231 of the second input stage 223 is configured to receive the second signal DQS2. The second input terminal 2232 of the second input stage 223 is configured to receive the first signal DQS1. The terminal 2233 is connected to the second output stage 224. The terminal 2234 is connected to the ground GND.

The second output stage 224 includes a transistor 224T and a resistor 224R. The transistor 224T may include a p-type MOSFET. The transistor 224T and the resistor 224R may be configured as a source follower. The transistor 224T has a drain D22 connected to the terminal 2233 of the second input stage 223, a gate G22 configured to receive the second signal DQS2, and a source S22 configured to output the second processed signal PDQS2. The source S22 of the transistor 224T is connected to the resistor 224R. The resistor 224R is connected to the supply voltage VDD. The second output stage 224 has an input terminal (i.e., the gate G22) configured to receive the second signal DQS2 and an output terminal (i.e., the source S22) configured to output the second processed signal PDQS2.

The state of the first input stage 221 is adjustable based on the first signal DQS1 and the second DQS2. If the first signal DQS1 and the second DQS2 are identical, e.g., having the same logic value, the first input stage 221 is open-circuit (or off). The open-circuit state of the first input stage 221 means that it is cut off. The equivalent resistance of the first input stage 221 is significantly larger than that of the resistor 222R. If the first signal DQS1 and the second DQS2 are different, e.g., having complementary logic values, the first input stage 221 is conducting (or on). The conducting state of the first input stage 221 means that it is turned on. The equivalent resistance of the first input stage 221 is significantly smaller than that of the resistor 222R.

When the first input stage 221 is open-circuit, the output terminal S11 of the first output stage 222 is pulled down to the ground, regardless of the logic value of the first signal DQS1. The first processed signal PDQS1 may have a low logic value "0". That is, the first input stage 221 is open-circuit to dissociate the first processed signal PDQS1 from the first signal DQS1.

The state of the second input stage 223 is adjustable based on the first signal DQS1 and the second DQS2. If the first signal DQS1 and the second DQS2 are identical, e.g., having the same logic value, the second input stage 223 is open-circuit. The open-circuit state (or off state) of the second input stage 223 means that it is cut off. The equivalent resistance of the second input stage 223 is significantly larger than that of the resistor 224R. If the first signal DQS1 and the second DQS2 are different, e.g., having complementary logic values, the second input stage 223 is conducting. The conducting state (or on state) of the second input stage 223 means that it is turned on. The equivalent resistance of the second input stage 223 is significantly smaller than that of the resistor 224R.

When the second input stage 223 is open-circuit, the output terminal S22 of the second output stage 224 is pulled up to the supply voltage VDD, regardless of the logic value of the second signal DQS2. The second processed signal PDQS2 may have a high logic value "1". That is, the second input stage 223 is open-circuit to dissociate the second processed signal PDQS2 from the second signal DQS2.

If the first signal DQS1 and the second DQS2 are identical, the first processed signal PDQS1 and the second processed signal PDQS2 are different, e.g., complementary. The table 1-2 describes the logic values of the first signal DQS1, the second signal DQS2, the first processed signal PDQS1, and the second processed signal PDQS2 according to the control unit 22.

TABLE 1-2

| DQS1 | DQS2 | PDQS1 | PDQS2 |
| --- | --- | --- | --- |
| 0 | 0 | 0 | 1 |
| 0 | 1 | 0 | 1 |
| 1 | 0 | 1 | 0 |
| 1 | 1 | 0 | 1 |

The adjustable state of the first input stage 221 and the second input stage 223 allows the control unit 22 to accept the first signal DQS1 and the second signal DQS2 which violate the JEDEC standard (e.g., the data strobe signals having the same logic value). In the open-circuit state, the control unit 22 is configured to regenerate the first processed signal PDQS1 and the second processed signal PDQS2, which are dissociated from the first signal DQS1 and the second signal DQS2. In the conducting state, the control unit 22 is configured to let the first processed signal PDQS1 and the second processed signal PDQS2 respectively follow the first signal DQS1 and the second signal DQS2. The first processed signal PDQS1 and the second processed signal PDQS2 may be identical to the first signal DQS1 and second signal DQS2, respectively. In both the open-circuit state and the conducting state, the processed signal PDQS1 and second processed signal PDQS2 can be complementary. With the control unit 22, the memory 11 can operate successfully with the first processed signal PDQS1 and the second processed signal PDQS2.

Figures 5, 6, 7:
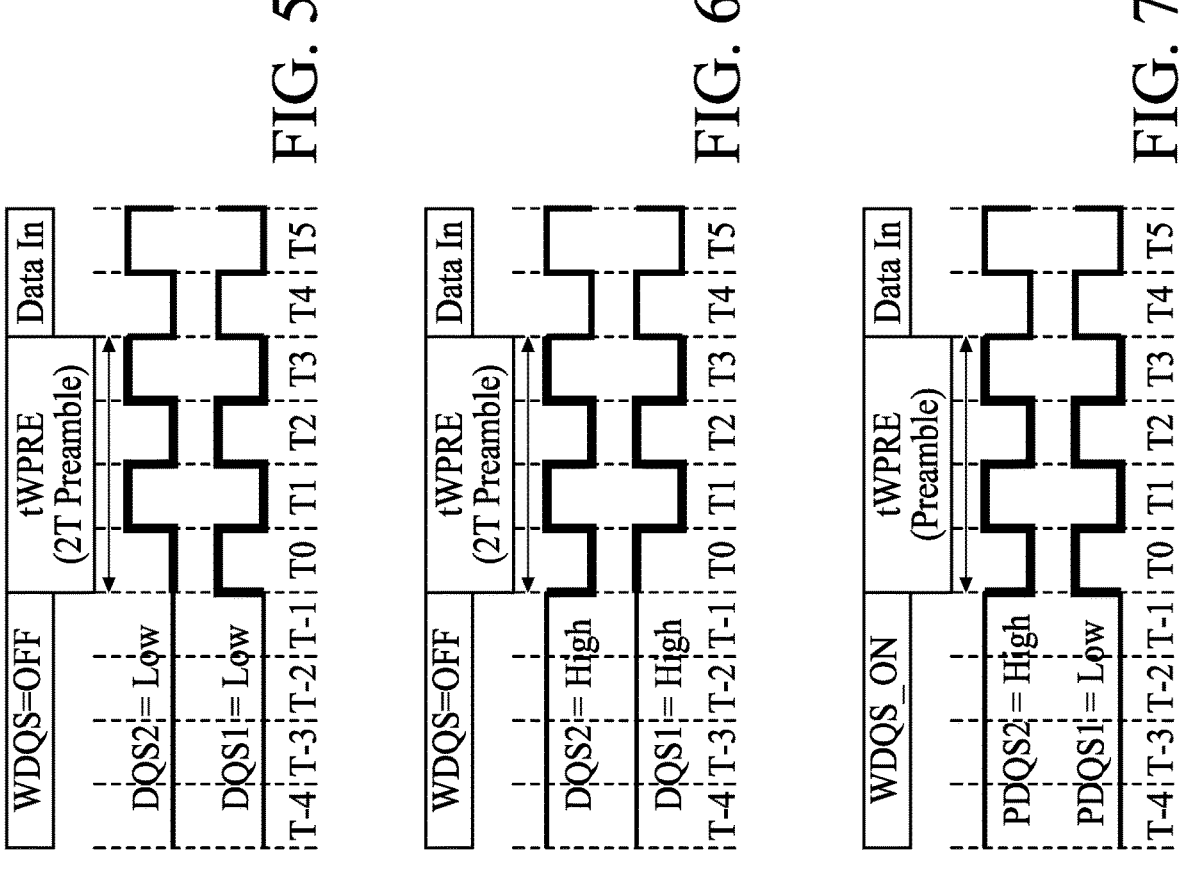
FIG. 5 is a timing diagram of an operation of the memory in accordance with some embodiments of the present disclosure.
FIG. 6 is a timing diagram of an operation of the memory in accordance with some embodiments of the present disclosure.
FIG. 7 is a timing diagram of an operation of the memory modified by the control unit in accordance with some embodiments of the present disclosure.

FIG. 5 is a timing diagram of an operation of the memory 11 in accordance with some embodiments of the present disclosure. As shown in FIG. 5, both the first signal DQS1 and the second signal DQS2 (e.g., the write data strobe signal) have a low logic value "Low" in the cycle periods T-4, T-3, T-2, and T-1. The data write operation of the memory 11 would fail because this violates the JEDEC standard. For example, the preamble in the cycle periods T0, T1, T2, and T3 prior to the data transmission is unable to align with the first signal DQS1 and the second signal DQS2. Subsequently, the data signal in the cycle periods T4 and T5 would not be transferred at the correct timing.

FIG. 6 is a timing diagram of an operation of the memory 11 in accordance with some embodiments of the present disclosure. As shown in FIG. 5, both the first signal DQS1 and the second signal DQS2 (e.g., the write data strobe signal) have a high logic value "High" in the cycle periods T-4, T-3, T-2, and T-1. The data write operation of the memory 11 would fail because this violates the JEDEC standard. For example, the preamble in the cycle periods T0, T1, T2, and T3 prior to the data transmission is unable to align with the first signal DQS1 and the second signal DQS2. Subsequently, the data signal in the cycle periods T4 and T5 would not be transferred at the correct timing.

FIG. 7 is a timing diagram of an operation of the memory 11 modified by the control unit 22 in accordance with some embodiments of the present disclosure. The control unit 22 is configured to regenerate a differential pair of data strobe signals, i.e., the first processed signal PDQS1 and the second processed signal PDQS2. If both the first signal DQS1 and the second signal DQS2 have a first logic value, e.g., "Low" in FIG. 5 or "High" in FIG. 6, one of the first processed signal PDQS1 and the second processed signal PDQS2 has a second logic value "Low" or "High," which is different from the first logic value. The first processed signal PDQS1 and the second processed signal PDQS2 in the cycle periods T-4, T-3, T-2, and T-1 comply with the JEDEC standard. The preamble in the cycle periods T0, T1, T2, and T3 prior to the data transmission can be aligned with the first processed signal PDQS1 and the second processed signal PDQS2. Subsequently, the data signal in the cycle periods T4 and T5 can be transferred at the correct timing.

Figure 8:
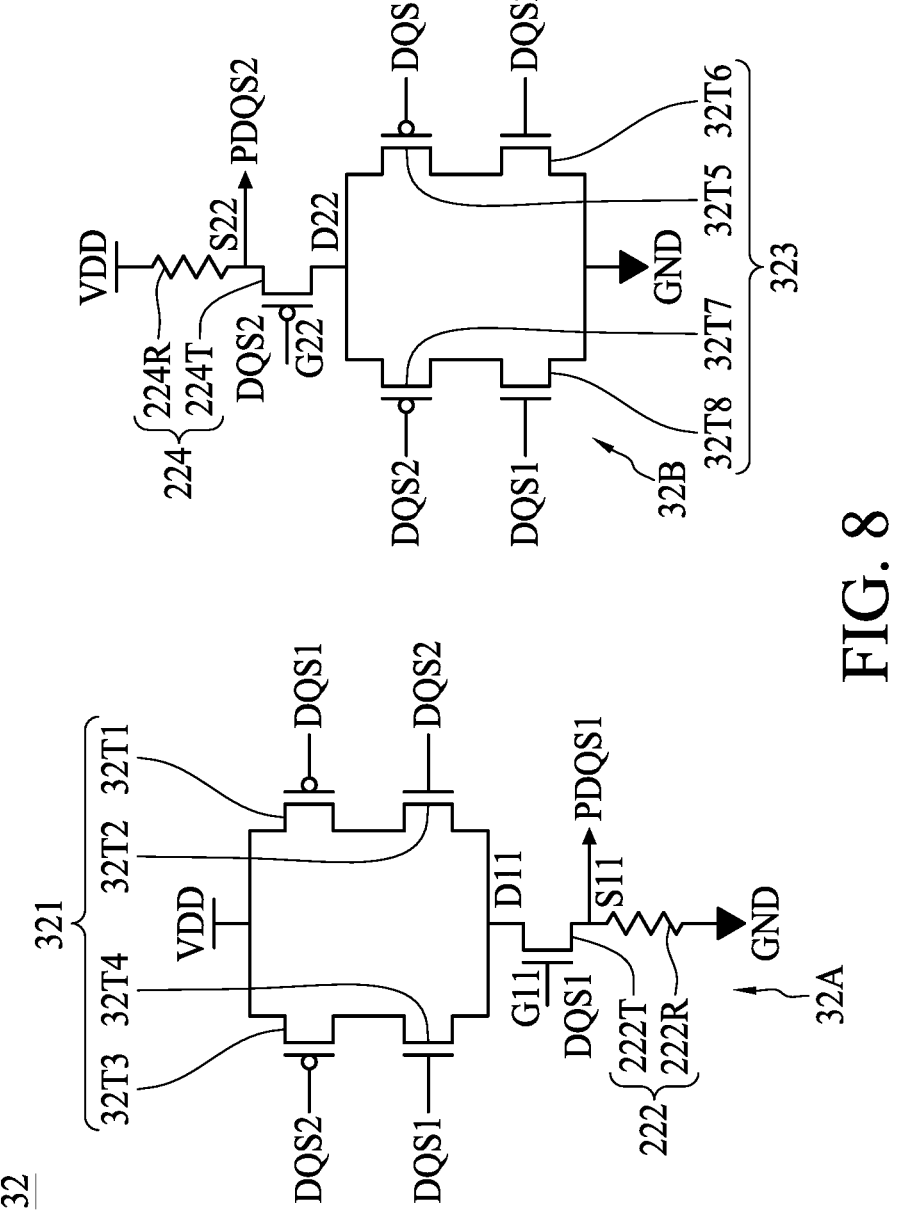
FIG. 8 is a schematic diagram of a control unit of a memory in accordance with some embodiments of the present disclosure.

FIG. 8 is a schematic diagram of a control unit 32 of a memory (e.g., the memory 11) in accordance with some embodiments of the present disclosure. The characteristics of the elements with the same reference numerals as those in FIG. 8 can refer to the relevant descriptions of FIG. 4.

The control unit 32 may include a first portion 32A and a second portion 32B. The first portion 32A includes a first input stage 321, rather than the first input stage 221 in FIG. 4. The second portion 32B includes a second input stage 323, rather than the second input stage 223 in FIG. 4.

The first input stage 321 includes a first p-type transistor 32T1, a first n-type transistor 32T2, a second p-type transistor 32T3, and a second n-type transistor 32T4. The first p-type transistor 32T1 and the second p-type transistor 32T3 may include a p-type MOSFET. The first n-type transistor 32T2 and the second n-type transistor 32T4 may include an n-type MOSFET. The first p-type transistor 32T1 and the first n-type transistor 32T2 are connected in series and referred to as a first series circuit. The second p-type transistor 32T3 and the second n-type transistor 32T4 are connected in series and referred to as a second series circuit. The first p-type transistor 32T1 and the second p-type transistor 32T3 are connected to the supply voltage VDD. The first n-type transistor 32T2 and the second n-type transistor 32T4 are connected to the first output stage 222.

The first p-type transistor 32T1 and the second n-type transistor 32T4 are configured to receive the first signal DQS1. In some embodiments, gates of the first p-type transistor 32T1 and the second n-type transistor 32T4 are configured to receive the first signal DQS1. The second p-type transistor 32T3 and the first n-type transistor 32T2 are configured to receive the second signal DQS2. In some embodiments, gates of the second p-type transistor 32T3 and the first n-type transistor 32T2 are configured to receive the second signal DQS2.

If the first signal DQS1 and the second signal DQS2 are identical, e.g., having a low logic value "0" or a high logic value "1", both the first series circuit and the second series circuit are cut off. The first input stage 321 is open-circuit (or off). The equivalent resistance of the first input stage 321 may be assumed infinite or is significantly greater than that of the resistor 222R. As such, the first output stage 222 pulls down the first processed signal PDQS1 to the ground GND. That is, the first input stage 321 is open-circuit to dissociate the first processed signal PDQS1 from the first signal DQS1. If the first signal DQS1 and the second signal DQS2 are different, e.g., complementary, one having a low logic value "0" and the other having a high logic value "1", at least one of the first series circuit and the second series circuit is turned on or conducting. The equivalent resistance of the first input stage 321 is equal to the drain-source on-resistance ($R_{DS}$(on)) of the transistors (e.g., 32T1 and 32T2) in series or significantly smaller than that of the resistor 222R. The first output stage 222 is connected to the supply voltage VDD via the conducting first input stage 321. As such, the first output stage 222 operates as a source follower to generate the first processed signal PDQS1 associated with the first signal DQS1. The first processed signal PDQS1 at the output terminal (i.e., the source S11) may follow the first signal DQS1 at the input terminal (i.e., the gate G11).

The second input stage 323 includes a first p-type transistor 32T5, a first n-type transistor 32T6, a second p-type transistor 32T7, and a second n-type transistor 32T8. The first p-type transistor 32T5 and the second p-type transistor 32T7 may include a p-type MOSFET. The first n-type transistor 32T6 and the second n-type transistor 32T8 may include an n-type MOSFET. The first p-type transistor 32T5 and the first n-type transistor 32T6 are connected in series and referred to as a third series circuit. The second p-type transistor 32T7 and the second n-type transistor 32T8 are connected in series and referred to as a fourth series circuit. The first p-type transistor 32T5 and the second p-type transistor 32T7 are connected to the second output stage 224. The first n-type transistor 32T6 and the second n-type transistor 32T8 are connected to the ground GND.

The first p-type transistor 32T5 and the second n-type transistor 32T8 are configured to receive the first signal DQS1. In some embodiments, gates of the first p-type transistor 32T5 and the second n-type transistor 32T8 are configured to receive the first signal DQS1. The second p-type transistor 32T7 and the first n-type transistor 32T6 are configured to receive the second signal DQS2. In some embodiments, gates of the second p-type transistor 32T7 and the first n-type transistor 32T6 are configured to receive the second signal DQS2.

If the first signal DQS1 and the second signal DQS2 are identical, e.g., having a low logic value "0" or a high logic value "1", both the third series circuit and the fourth series circuit are cut off. The second input stage 323 is open-circuit (or off). The equivalent resistance of the second input stage 323 may be assumed infinite or is significantly greater than that of the resistor 224R. As such, the second output stage 224 pulls up the second processed signal PDQS2 to the supply voltage VDD. That is, the second input stage 323 is open-circuit to dissociate the second processed signal PDQS2 from the second signal DQS2. If the first signal DQS1 and the second signal DQS2 are different, e.g., complementary, one having a low logic value "0" and the other having a high logic value "1", at least one of the third series circuit and the fourth series circuit is turned on. The equivalent resistance of the second input stage 323 is equal to the drain-source on-resistance ($R_{DS}$(on)) of the transistors (e.g., 32T5 and 32T6) in series or significantly smaller than that of the resistor 224R. The second output stage 224 is connected to the ground GND via the conducting second input stage 323. As such, the second output stage 224 operates as a source follower to generate the second processed signal PDQS2 associated with the second signal DQS2. The second processed signal PDQS2 at the output terminal (i.e., the source S22) may follow the second signal DQS2 at the input terminal (i.e., the gate G22).

The adjustable state of the first input stage 321 and the second input stage 323 allows the control unit 22 to accept the first signal DQS1 and the second signal DQS2 which violate the JEDEC standard (e.g., the data strobe signals having the same logic value). In the open-circuit state (or off state), the control unit 22 is configured to regenerate the first processed signal PDQS1 and the second processed signal PDQS2 dissociated from the first signal DQS1 and the second signal DQS2. In the conducting state (or on state), the control unit 22 is configured to let the first processed signal PDQS1 and the second processed signal PDQS2 respectively follow the first signal DQS1 and the second signal DQS2. The first processed signal PDQS1 and the second processed signal PDQS2 may be identical to the first signal DQS1 and second signal DQS2, respectively. In both the open-circuit state and the conducting state, the processed signal PDQS1 and the second processed signal PDQS2 can be complementary. The memory 11 can operate successfully with the first processed signal PDQS1 and the second processed signal PDQS2.

Figure 9:
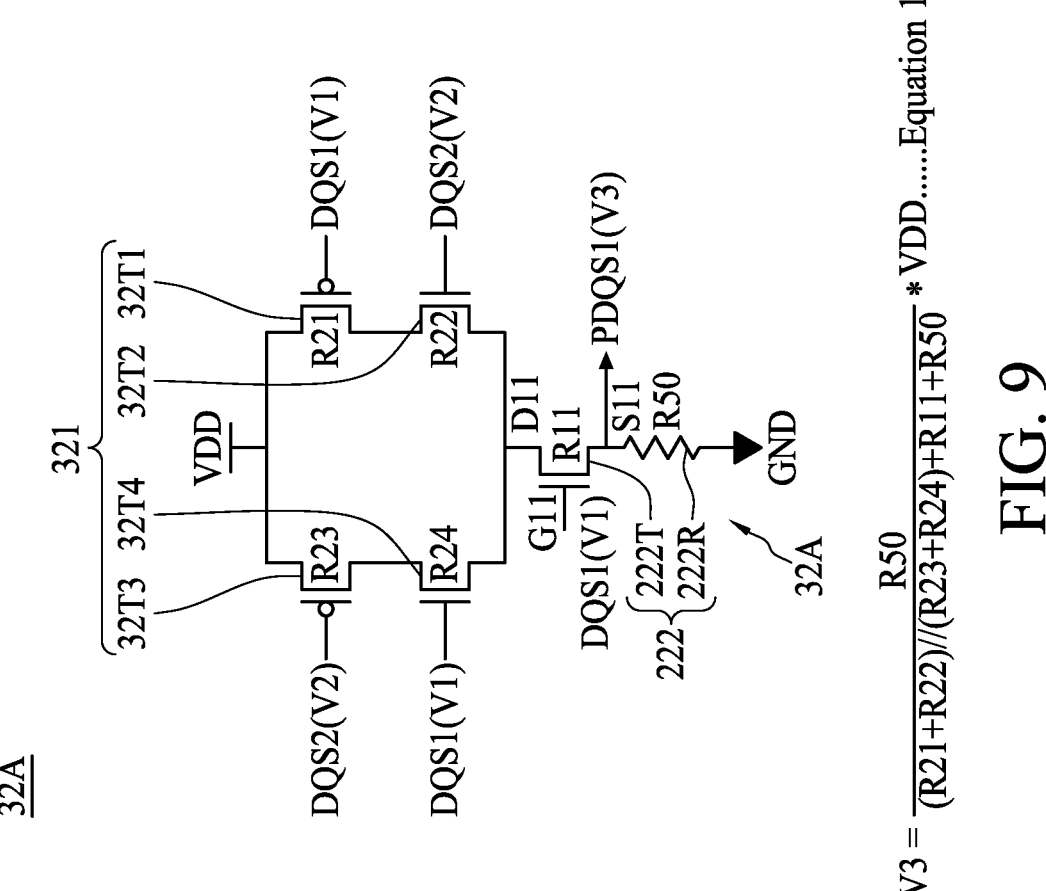
FIG. 9 is a schematic diagram of a first portion of a control unit of a memory in accordance with some embodiments of the present disclosure.

FIG. 9 is a schematic diagram of a first portion (e.g., the first portion 32A) of a control unit (e.g., the control unit 32) of a memory (e.g., the memory 11) in accordance with some embodiments of the present disclosure. FIG. 9 illustrates the operation of the first portion 32A in analogous signals.

The first signal DQS1 has a voltage value V1. The second signal DQS2 has a voltage value V2. The first p-type transistor 32T1 has a resistance R21. The first n-type transistor 32T2 has a resistance R22. The second p-type transistor 32T3 has a resistance R23. The second n-type transistor 32T4 has a resistance R24. The equivalent resistance of the first input stage 321 is (R21+R22)//(R23+R24). The transistor 222T has a resistance R11. The transistor 222R has a resistance R50 which may equal 100K ohm.

A voltage value V3 of the first processed signal PDQS1 is derived from the following equation:

$$V3 = \frac{R50}{(R21 + R22)//(R23 + R24) + R11 + R50} * VDD \qquad \text{Equation 1}$$

The ratio of the voltage value V3 of the first processed signal PDQS to the supply voltage VDD is equal to the resistance R50 over the sum of the resistance R50, the resistance R11, and the equivalent resistance (R21+R22)// (R23+R24).

In some embodiments, when the voltage value V1 of the first signal DQS1 is 0V and the voltage value V2 of the second signal DQS2 is 0V, the p-type transistors 32T1 and 32T3 are on and the n-type transistors 32T2 and 32T4 and the transistor 222T are off. The resistance R21 and the resistance R23 equal about 0 ohm, the resistance R22 and the resistance R24 equal about 2 M ohm, and the resistance R11 equals about 2 M ohm. The voltage value V3 of the first processed signal PDQS1 equals about 0.03V, which is approximately 0V.

In some embodiments, when the voltage value V1 of the first signal DQS1 is 1V and the voltage value V2 of the second signal DQS2 is 1V, the p-type transistors 32T1 and 32T3 are off and the n-type transistors 32T2 and 32T4 and the transistor 222T are on. The resistance R21 and the resistance R23 equal about 2 M ohm, the resistance R22 and the resistance R24 equal about 0 ohm, and the resistance R11 equals about 0 ohm. The voltage value V3 of the first processed signal PDQS1 equals about 0.09V, which is approximately 0V.

In some embodiments, when the voltage value V1 of the first signal DQS1 is 1V and the voltage value V2 of the second signal DQS2 is 0V, the first p-type transistor 32T1 and the first n-type transistor 32T2 are off and the second p-type transistor 32T3 and the second n-type transistor 32T4 and the transistor 222T are on. The resistance R21 and the resistance R22 equal about 2 M ohm, the resistance R23 and the resistance R24 equal about 0 ohm, and the resistance R11 equals about 0 ohm. The voltage value V3 of the first processed signal PDQS1 equals about 1V.

In some embodiments, when the voltage value V1 of the first signal DQS1 is 0.3V and the voltage value V2 of the second signal DQS2 is 0.7V, the resistance R21 and the resistance R22 equal about 30K ohm, the resistance R23 and the resistance R24 equal about 70K ohm, and the resistance R11 equals about 70K ohm. The voltage value V3 of the first processed signal PDQS1 equals about 0.47V.

Figure 10:
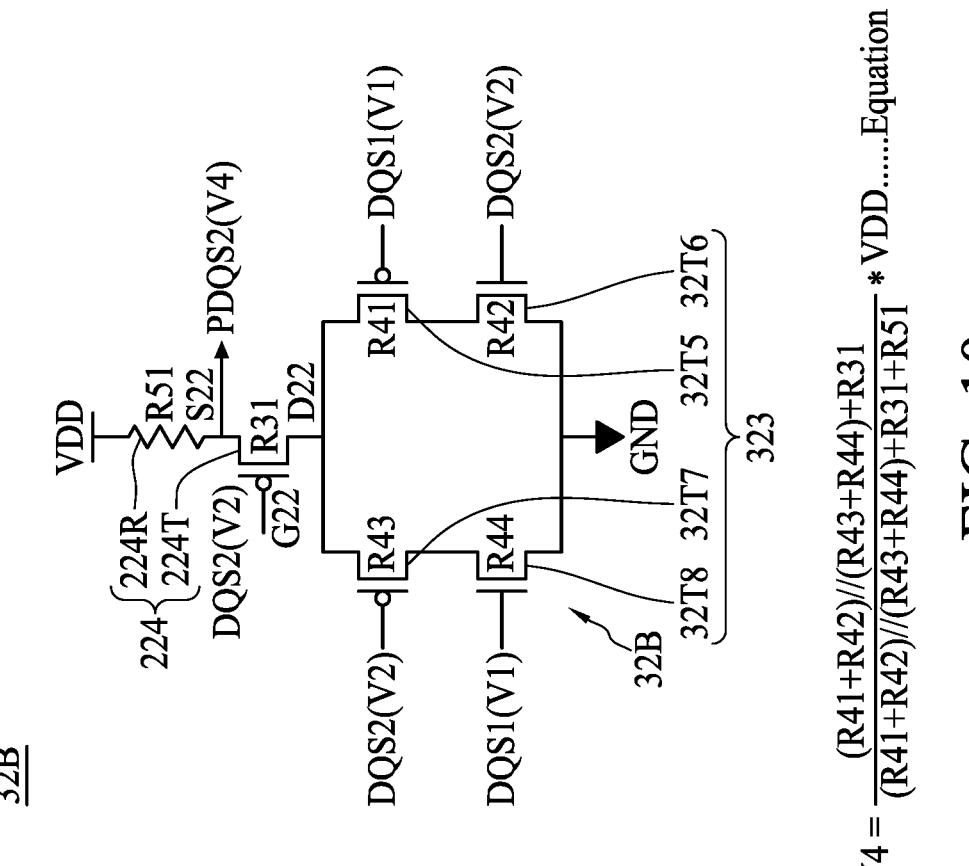
FIG. 10 is a schematic diagram of a second portion of a control unit of a memory in accordance with some embodiments of the present disclosure.

FIG. 10 is a schematic diagram of a second portion (e.g., the second portion 32B) of a control unit (e.g., the control unit 32) of a memory (e.g., the memory 11) in accordance with some embodiments of the present disclosure. FIG. 10 illustrates the operation of the second portion 32B in analogous signals.

The first signal DQS1 has a voltage value V1. The second signal DQS2 has a voltage value V2. The first p-type transistor 32T5 has a resistance R41. The first n-type transistor 32T6 has a resistance R42. The second p-type transistor 32T7 has a resistance R43. The second n-type transistor 32T8 has a resistance R44. The equivalent resistance of the second input stage 323 is (R41+R42)//(R43+R44). The transistor 224T has a resistance R31. The transistor 224R has a resistance R51 which may equal 100K ohm.

A voltage value V4 of the second processed signal PDQS2 is derived from the following equation:

$$V4 = \frac{(R41 + R42)//(R43 + R44) + R31}{(R41 + R42)//(R43 + R44) + R31 + R51} * VDD \qquad \text{Equation 2}$$

The ratio of the voltage value V4 of the first processed signal PDQS1 to the supply voltage VDD is equal to the sum of the resistance R31 and the equivalent resistance (R41+ R42)//(R43+R44) over the sum of the resistance R51, the resistance R31, and the equivalent resistance (R41+R42)// (R43+R44).

In some embodiments, when the voltage value V1 of the first signal DQS1 is 0V and the voltage value V2 of the second signal DQS2 is 0V, the p-type transistors 32T5 and 32T7 and the transistor 224T are on and the n-type transistors 32T6 and 32T8 are off. The resistance R41 and the resistance R43 equal about 0 ohm, the resistance R42 and the resistance R44 equal about 2 M ohm, and the resistance R31 equals about 0 ohm. The voltage value V4 of the second processed signal PDQS2 equals about 0.97V, which is approximately 1V.

In some embodiments, when the voltage value V1 of the first signal DQS1 is 1V and the voltage value V2 of the second signal DQS2 is 0V, the first p-type transistor 32T5 and the first n-type transistor 32T6 are off and the second p-type transistor 32T7 and the second n-type transistor 32T8 and the transistor 224T are on. The resistance R41 and the resistance R42 equal about 2 M ohm, the resistance R43 and the resistance R44 equal about 0 ohm, and the resistance R31 equals about 0 ohm. The voltage value V4 of the second processed signal PDQS2 equals about 0V.

Figure 11:
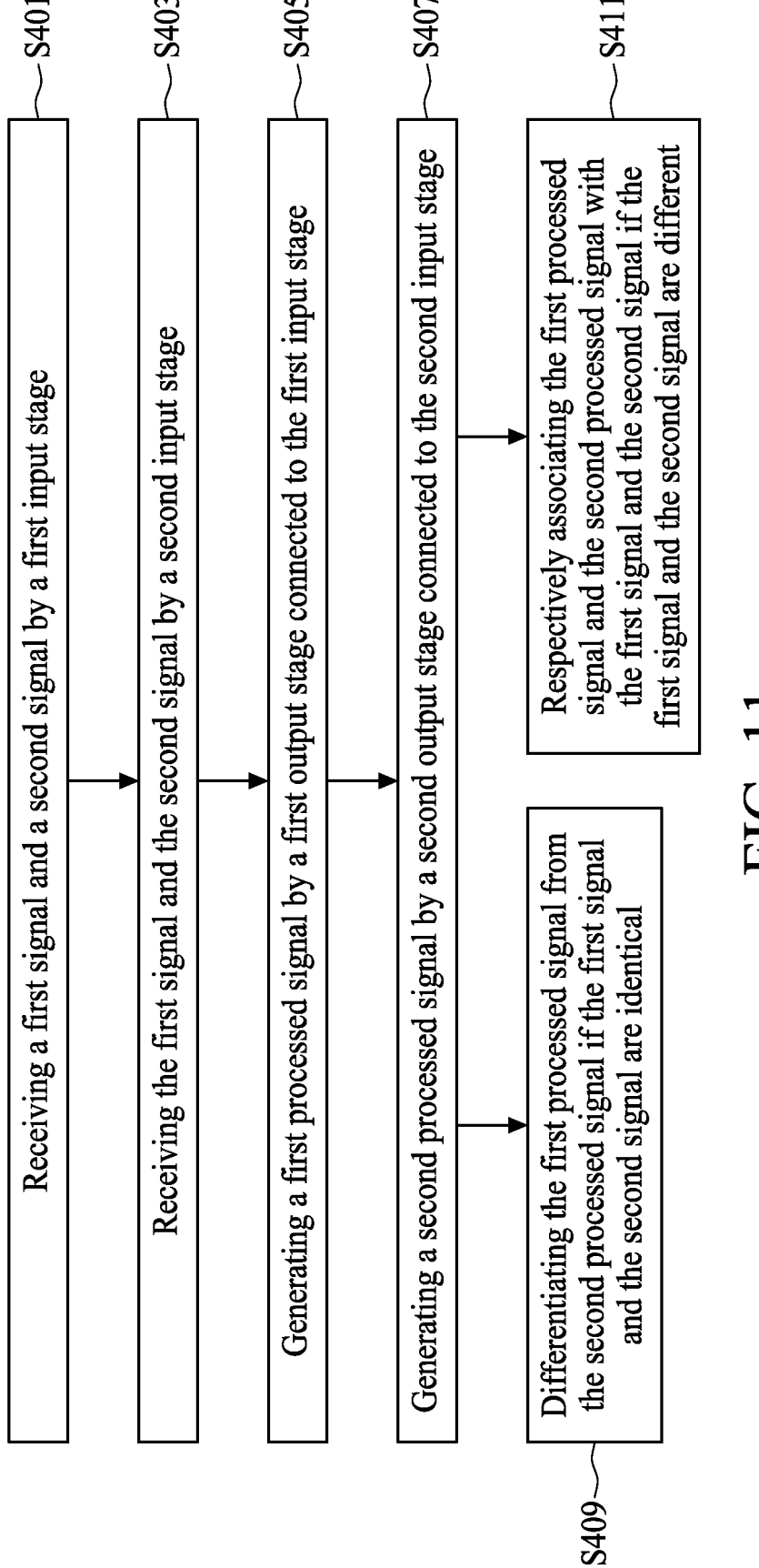
FIG. 11 is a flowchart of a method of controlling a memory, in accordance with some embodiments of the present disclosure.

FIG. 11 is a flowchart of a method 400 of controlling a memory (e.g., the memory 11), in accordance with some embodiments of the present disclosure.

The method 400 begins with operation S401 comprising receiving a first signal (e.g., the first signal DQS1) and a second signal (e.g., the second signal DQS2) by a first input stage (e.g., the first input stage 221 or 321). The first signal and the second signal may be write data strobe signals from a controller (e.g., the controller 10).

The method 400 continues with operation S403 comprising receiving the first signal and the second signal by a second input stage (e.g., the second input stage 223 or 323).

The method 400 continues with operation S405 comprising generating a first processed signal (e.g., the first processed signal PDQS1) by a first output stage (e.g., the first output stage 222) connected to the first input stage. The first output stage may have an input terminal configured to receive the first signal and an output terminal configured to output the first processed signal.

The method 400 continues with operation S407 comprising generating a second processed signal (e.g., the second processed signal PDQS2) by a second output stage (e.g., the second output stage 224) connected to the second input stage. The second output stage may have an input terminal configured to receive the second signal and an output terminal configured to output the second processed signal.

The method 400 continues with operation S409 comprising differentiating the first processed signal from the second processed signal if the first signal and the second signal are identical. The first processed signal and the second processed signal are complementary. Operation S409 may include dissociating the first processed signal and the second processed signal from the first signal and the second signal, respectively.

The method 400 continues with operation S411 comprising associating the first processed signal and the second processed signal with the first signal and the second signal, respectively, if the first signal and the second signal are different. The operation S411 may include letting the first processed signal and the second processed signal follow the first signal and the second signal.

With the method 400, the first processed signal and the second processed signal are complementary, regardless of the first signal and the second signal being identical or different. The memory can operate successfully with the complementary first processed signal and the second processed signal, even if the first signal and the second signal (e.g., the write data strobe signal from a controller) violate the JEDEC standard.

The method 400 is merely an example, and is not intended to limit the present disclosure beyond what is explicitly recited in the claims. Additional operations can be provided before, during, or after each operation of the method 400, and some operations described can be replaced, eliminated, or reordered for additional embodiments of the method. In some embodiments, the method 400 can include further operations not depicted in FIG. 11. In some embodiments, the method 400 can include one or more operations depicted in FIG. 11.

Figure 12:
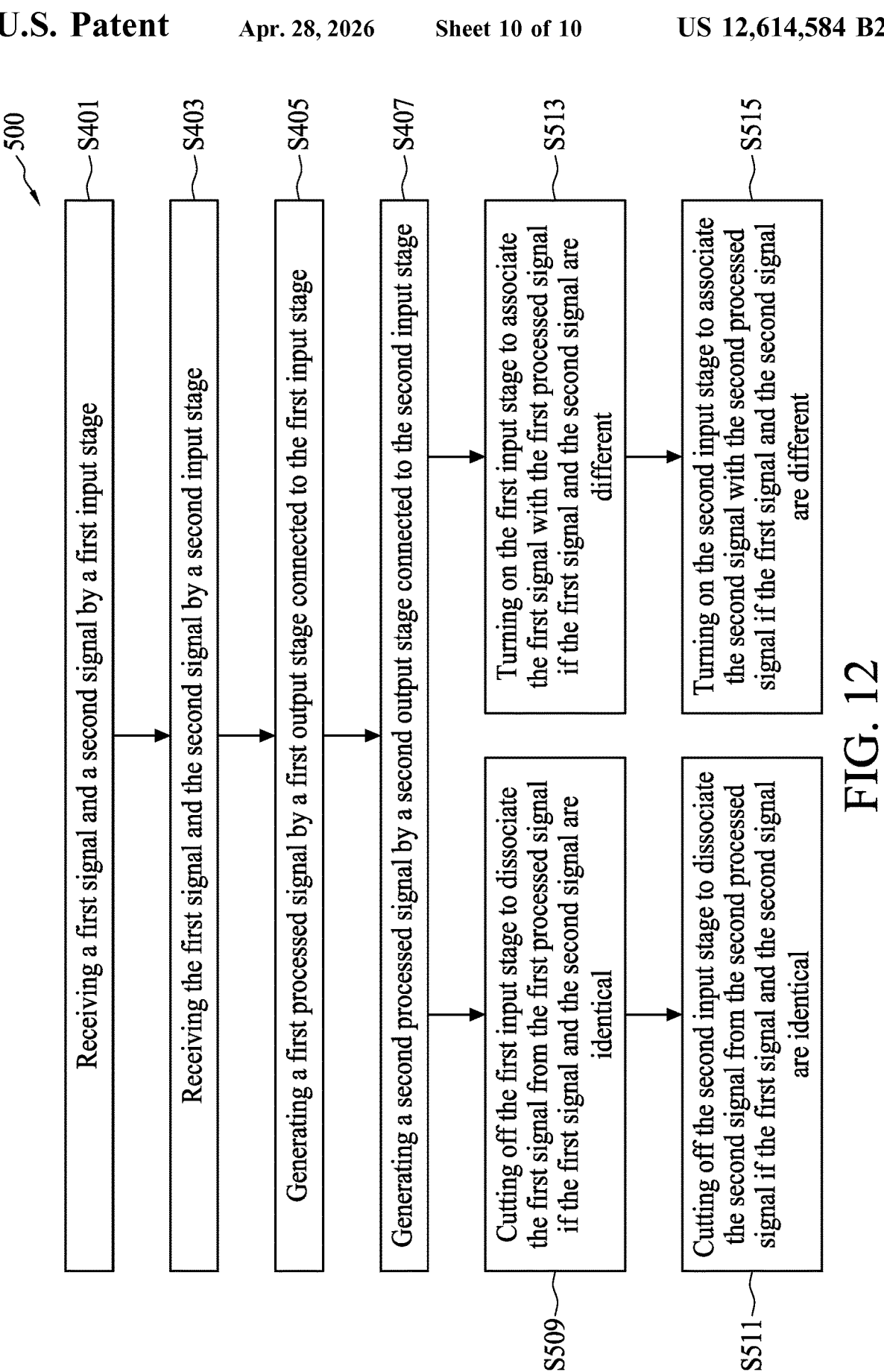
FIG. 12 is a flowchart of a method of controlling a memory, in accordance with some embodiments of the present disclosure.

FIG. 12 is a flowchart of a method 500 of controlling a memory (e.g., the memory 11), in accordance with some embodiments of the present disclosure. The characteristics of the elements with the same reference numerals as those in FIG. 12 can refer to the relevant descriptions of FIG. 11.

The method 500 includes the operations S401, S403, S405, and S407.

The method 500 continues with operation S509 comprising cutting off the first input stage to dissociate the first signal from the first processed signal if the first signal and the second signal are identical. Operation S509 may include pulling down the first processed signal to a ground (e.g., GND) by the first output stage.

The method 500 continues with operation S511 comprising cutting off the second input stage to dissociate the second signal from the second processed signal if the first signal and the second signal are identical. Operation S511 may include pulling up the second processed signal to a supply voltage (e.g., VDD) by the second output stage.

The method 500 continues with operation S513 comprising turning on the first input stage to associate the first signal with the first processed signal if the first signal and the second signal are different. Operation S513 may include letting the first processed signal follow the first signal by the first output stage.

The method 500 continues with operation S515 comprising turning on the second input stage to associate the second signal with the second processed signal if the first signal and the second signal are different. Operation S515 may include letting the second processed signal follow the second signal by the second output stage.

With the method 500, the regenerated first processed signal and the second processed signal are complementary, regardless of the first signal and the second signal being identical or different. The memory can operate successfully with the first processed signal and the second processed signal PDQS2, even if the first signal and the second signal (e.g., the write data strobe signal from a controller) violate the JEDEC standard.

One aspect of the present disclosure provides a control unit of a memory including a first input stage, a second input stage, a first output stage, and a second output stage. The first input stage is configured to receive a first signal and a second signal. The second input stage is configured to receive the first signal and the second signal. The first output stage is connected to the first input stage and configured to generate a first processed signal. The second output stage is connected to the second input stage and configured to generate a second processed signal. If the first signal and the second signal are identical, the first processed signal and the second processed signal are different.

Another aspect of the present disclosure provides a control unit of a memory including a first input stage and a first output stage. The first input stage includes a first input terminal configured to receive a first signal and a second input terminal configured to receive a second signal. The first output stage is connected to the first input stage and includes an output terminal configured to generate a first processed signal. If the first signal and the second signal are identical, the first input stage is open-circuit to dissociate the first processed signal from the first signal.

Another aspect of the present disclosure provides a method of controlling a memory, including receiving a first signal and a second signal by a first input stage; receiving the first signal and the second signal by a second input stage; generating a first processed signal by a first output stage connected to the first input stage; generating a second processed signal by a second output stage connected to the second input stage; and differentiating the first processed signal from the second processed signal if the first signal and the second signal are identical.

The control unit of the memory of the present disclosure includes a first input stage, a second input stage, a first output stage, and a second output stage. The first input stage and the second input stage are configured to receive a first signal and a second signal (e.g., from a memory controller). The first output stage and the second output stage are configured generate a first processed signal and a second processed signal, which may be transmitted to an internal control circuit of the memory or may be used as a clock signal of the data lines of the memory for synchronization. The state of the first input stage and the second input stage change based on whether the first signal and the second signal are identical or different. If the first signal and the second signal are identical, the first input stage and the second input stage are open-circuit to differentiate the first processed signal from the second processed signal. The first processed signal is dissociated from the first signal, and the second processed signal is dissociated from the second signal. If the first signal and the second signal are different, the first input stage and the second input stage are conducting to associate the first processed signal and the second processed signal to the first signal and the second signal, respectively (i.e., the first processed signal and the second processed signal being identical to the first signal and the second signal, respectively). The adjustable state of the first input stage and the second input stage allows the control unit to accept the first signal and the second signal which violate the JEDEC standard (e.g., the data strobe signals having the same value). In the conducting state, the control unit is configured to let the first processed signal and the second processed signal follow the first signal and the second signal. In the open-circuit state, the control unit is configured to regenerate the first processed signal and the second processed signal, which are dissociated from the first signal and the second signal. The memory can operate successfully with the first processed signal and the second processed signal.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A control unit of a memory, comprising:
a first input stage configured to receive a first signal and a second signal;
a second input stage configured to receive the first signal and the second signal;
a first output stage connected to the first input stage and configured to generate a first processed signal; and
a second output stage connected to the second input stage and configured to generate a second processed signal,
wherein, if the first signal and the second signal are identical, the first processed signal and the second processed signal are different;
wherein the first signal and the second signal are write data strobe signals;
wherein the first output stage includes a first transistor and a first resistor connected to the first transistor and a ground, wherein the first transistor has a drain connected to the first input stage and a gate configured to receive the first signal, and a source configured to output the first processed signal.

2. The control unit of claim 1, wherein the first signal and the second signal are transmitted from a controller.

3. The control unit of claim 1, wherein, if the first signal and the second signal are different, the first processed signal and the second processed signal are identical to the first signal and the second signal, respectively.

4. The control unit of claim 3, wherein the first signal and the second signal are complementary.

5. The control unit of claim 1, wherein the first processed signal and the second processed signal are complementary, regardless of the first signal and the second signal being identical or different.

6. The control unit of claim 1, wherein, if both the first signal and the second signal have a first logic value, one of the first processed signal and the second processed signal has a second logic value different from the first logic value.

7. The control unit of claim 1, wherein the second output stage includes a second transistor and a second resistor connected to the second transistor and a supply voltage, wherein the second transistor has a drain connected to the second input stage and a gate configured to receive the second signal, and a source configured to output the second processed signal.

8. The control unit of claim 1, wherein the second input stage includes a first p-type transistor, a second p-type transistor, a first n-type transistor, and a second n-type transistor, and wherein the first p-type transistor and the first n-type transistor are connected in series and the second p-type transistor and the second n-type transistor are connected in series.

9. The control unit of claim 8, wherein the first p-type transistor and the second n-type transistor are configured to receive the first signal, and the second p-type transistor and the first n-type transistor are configured to receive the second signal.

10. The control unit of claim 9, wherein the first p-type transistor and the second p-type transistor are connected to the second output stage and the first n-type transistor and the second n-type transistor are connected to a ground.

11. A control unit of a memory, comprising:
a first input stage configured to receive a first signal and a second signal;
a second input stage configured to receive the first signal and the second signal;
a first output stage connected to the first input stage and configured to generate a first processed signal; and
a second output stage connected to the second input stage and configured to generate a second processed signal,
wherein, if the first signal and the second signal are identical, the first processed signal and the second processed signal are different;
wherein the first signal and the second signal are write data strobe signals;
wherein the first input stage includes a first p-type transistor, a second p-type transistor, a first n-type transistor, and a second n-type transistor, and wherein the first p-type transistor and the first n-type transistor are connected in series and the second p-type transistor and the second n-type transistor are connected in series.

12. The control unit of claim 11, wherein the first p-type transistor and the second n-type transistor are configured to receive the first signal, and the second p-type transistor and the first n-type transistor are configured to receive the second signal.

13. The control unit of claim 12, wherein the first p-type transistor and the second p-type transistor are connected to a supply voltage and the first n-type transistor and the second n-type transistor are connected to the first output stage.

* * * * *